(12) United States Patent
Hirakawa et al.

(10) Patent No.: US 6,484,708 B2
(45) Date of Patent: Nov. 26, 2002

(54) RESIN SEALED ELECTRONIC DEVICE

(75) Inventors: Satoshi Hirakawa, Hitachinaka (JP); Toshiaki Kaminaga, Naka-machi (JP); Ryoichi Kobayashi, Tokai-mura (JP); Noboru Sugiura, Mito (JP)

(73) Assignees: Hitachi, Ltd., Tokyo (JP); Hitachi Car Engineering Co., Ltd., Hitachinaka (JP)

( * ) Notice: Subject to any disclaimer, the term of this patent is extended or adjusted under 35 U.S.C. 154(b) by 0 days.

(21) Appl. No.: 10/040,463

(22) Filed: Jan. 9, 2002

(65) Prior Publication Data

US 2002/0104519 A1 Aug. 8, 2002

Related U.S. Application Data

(63) Continuation of application No. 09/605,051, filed on Jun. 28, 2000, now abandoned.

(30) Foreign Application Priority Data

Jun. 28, 1999 (JP) ............................................. 11-181071

(51) Int. Cl.[7] .............................. F02P 15/00; H05K 5/06
(52) U.S. Cl. ........................ 123/647; 361/705; 361/719
(58) Field of Search .................................. 123/647, 651; 361/704, 705, 718, 719

(56) References Cited

U.S. PATENT DOCUMENTS

| 5,157,478 A | * | 10/1992 | Ueda et al. ................. 257/796 |
| 5,877,043 A | * | 3/1999 | Alcoe et al. ................ 438/123 |
| 6,223,429 B1 | * | 5/2001 | Kaneda et al. ............... 29/832 |

FOREIGN PATENT DOCUMENTS

| JP | B2-2590601 | 12/1996 |
| JP | A-9-177647 | 7/1997 |

* cited by examiner

*Primary Examiner*—Tony M. Argenbright
(74) *Attorney, Agent, or Firm*—Crowell & Moring LLP

(57) ABSTRACT

Durability and lifetime of a resin sealed electronic device is improved by reducing thermal stresses acting on the power element and the parts mounting on the board. A power element of which the protective film on the power element is coated with a polyimide group resin at manufacturing the element is used, and a metallic heat sink of which the reverse side surface (portion of mounting on a board) is not plated is used. Further, a linear expansion coefficient of the molding resin is within a range of $3 \times 10^{-6}/°C$. to $17 \times 10^{-6}/°C$. The durability and the lifetime of the resin sealed electronic device is improved, because the thermal stresses are reduced by balancing linear expansion coefficients of the parts.

5 Claims, 6 Drawing Sheets

RESIN SEALED ELECTRONIC DEVICE

This application is a continuation of application Ser. No. 09/605,051 filed Jun. 28, 2000, now abandoned.

BACKGROUND OF THE INVENTION

The present invention, relates to a structure of a resin sealed electronic device and, more particularly to a package structure and configuration to improve its reliability.

The prior art of a semiconductor package structure for an internal combustion engine, particularly of an igniter, as disclosed in Japanese Patent No.2,590,601, proposes to seal a circuit board and a semiconductor element with transfer mold. Further, Japanese Patent Application Laid-Open No.9-177647 discloses an igniter which is formed in one chip by constructing a function circuit on a semiconductor chip.

In a case where a hybrid IC board and a semiconductor power element are mounted on a single heat sink portion and sealed with transfer mold, it is particularly necessary to pay attention to thermal stresses acting on the contained parts. Since an amount of thermal deformation is large particularly in the portion of the semiconductor element having a large amount of self-heat generation, there occurs a problem in lifetime of solder used for mounting the semiconductor power element. Silicone which is a main material composing the semiconductor power element has a linear expansion coefficient of $3 \times 10^{-6}/°C$., and on the other hand the metallic heat sink (usually made of a copper group material) mounting the semiconductor power element has a large linear expansion coefficient as large as $17 \times 10^{-6}/°C$. Therefore, large stresses such as a shear stress caused by the difference between the linear expansion coefficients and a bending stress caused by the bimetal effect occur in the solder used for mounting the power element. In addition, in a case of containing a hybrid IC board, thermal stresses acting on the board must be also taken into consideration. In a case of using a hybrid IC board made of an alumina group material, the linear expansion coefficient is around $7 \times 10^{-6}/°C$., and is also different from the thermal expansion coefficient of the heat sink. Therefore, it is necessary to improve the lifetime of the resin sealed electronic devices by optimizing specifications of the linear expansion coefficient of the resin used; the method of coating the surface of the semiconductor power element; and the heat sink mounting the board and the semiconductor power element so as to reduce the effect of thermal stresses acting on the contained parts.

SUMMARY OF THE INVENTION

In order solve the above problem, by using a switching semiconductor element of which the protective film on the power element is coated with a polyimide group or a polyamide group resin when the used semiconductor power element is manufactured, tightness of adhesion of the semiconductor power element to the transfer mold resin is improved. By doing so, the thermal displacement of the semiconductor power element is restrained to reduce the thermal stress acting on the soldered portion. In general, a semiconductor element is provided with a protective film of some kind at the end in manufacturing. Therefore, it is easy that a protective film made of a polyimide group or polyamide group resin is employed as the protective film in that manufacturing process. On the other hand, there is a method to improve the restraining force by dropping and curing a resin of such kind after mounting the semiconductor element. However, the method increases number of manufacturing processes to increase its cost.

In general, in order to mount a semiconductor element, a metallic heat sink has nickel plating on its mounting surface or additionally has silver plating or the like on the nickel plating. There are two plating methods, that is, one is that the heat sink is plated after being pressed into a part-mounting shape, and the other is that the heat sink is plated before being pressed. These kinds of plating are poor in adhesion to the resin, and consequently weak in a force restraining the heat sink portion. Particularly, in the case of plating after being pressed, it is difficult to plate only the mounting area, and accordingly all over the surface is plated. From the viewpoint of thermal deformations of the semiconductor parts, the board and the heat sink, in order to improve reliability a method of restraining these contained parts is employed by fully molding all the parts with transfer mold. However, when all the surface is plated, separation of interface easily occurs particularly in the reverse side surface of the area not mounting the parts due to the poor adhesion with the resin, and as a result the thermal deformation can not be restrained and accordingly the reliability can not be improved. In order to solve the problem, it is considered that the polyimide group or the polyamide group resin is applied to the surface or that the surface is coated with the resin as the semiconductor power element. However, the method adds number of manufacturing processes such as applying and curing processes.

Therefore, the heat sink is plated when it is in its material state, and the reverse side surface of the surface mounting the parts is masked so as to be not plated. The base material surface of the metallic material (a copper group or an aluminum group material) is tighter in adhesion to the resin compared to that of the plating described above, and consequently the thermal displacement can be restrained.

As described above, the semiconductor parts and the board are actually mounted on the surface of mounting the parts, and the exposed plated area having a weak adhering force is small. Therefore, tightness of adhesion of the semiconductor power element to the resin is maintained by coating the surface of the element, and tightness of adhesion of the reverse side surface to the transfer mold resin is improved by the base material surface of the metallic material without the plating. By doing so, the thermal displacement of the portion of the semiconductor power element is reduced by restraining the upper and the lower surfaces. On the other hand, in regard to the portion of the hybrid IC, the difference of the linear expansion coefficients between the substrate material of the aluminum group ceramic and the metallic heat sink material (the copper group or the aluminum group material) is small compared to the difference in the portion of the power element. Therefore, the reliability can be improved by improving the tightness of adhesion of the reverse side surface of the heat sink to the resin to restrain the displacement in the heat sink side.

In order to improve the tightness of adhesion of the reverse side surface to the resin, it is possible to further improve tightness of adhesion in the interface by forming projections and depressions on the reverse side surface of the heat sink portion to increase the contact area.

In that case, the thermal stresses acting on the contained parts can be reduced by using a mold resin having a linear expansion coefficient within a range of the smallest linear expansion coefficient ($3 \times 10^{-6}/°C$.) of silicon in the semiconductor element among the constituent materials of the contained parts to the linear expansion coefficient ($17 \times 10^{-6}/°C$.) of copper among the metallic materials (the copper group or the aluminum group material) to be used for the heat sink which has the largest volume.

DESCRIPTION OF THE PREFERRED EMBODIMENTS

Embodiments of the present invention will be described below.

Figure 1:
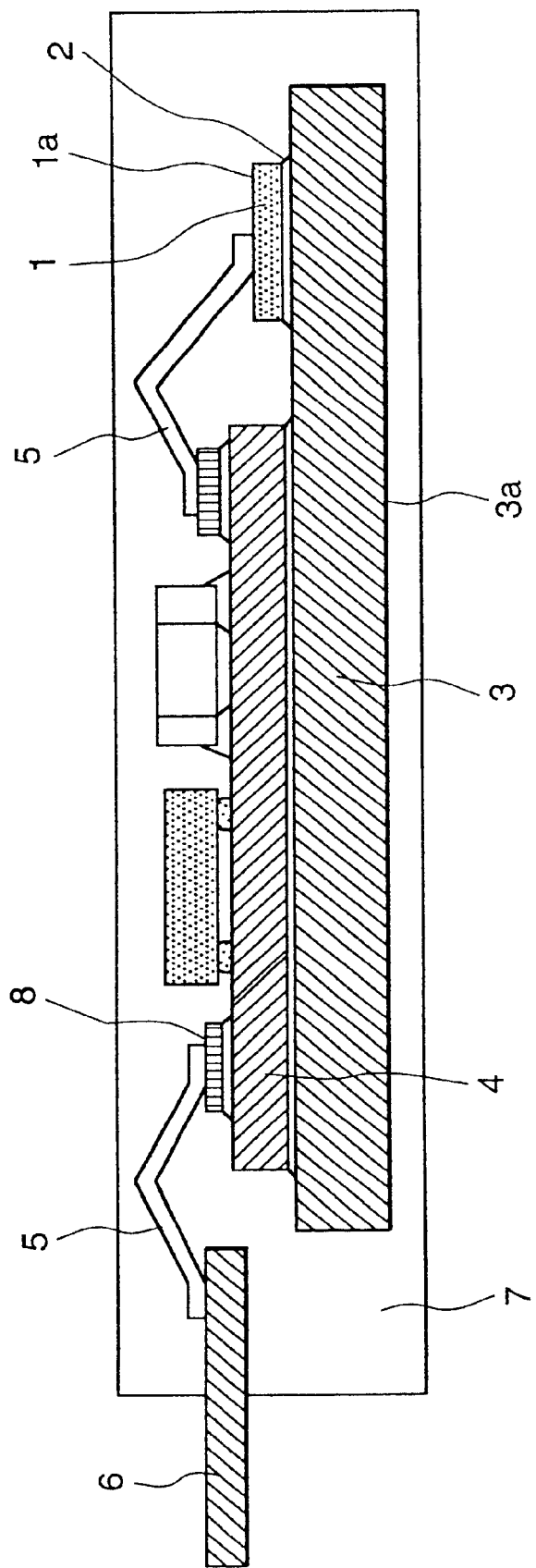
FIG. 1 is a cross-sectional side view showing an embodiment of a resin sealed electronic device in accordance with the present invention.

FIG. 1 is a cross-sectional side view showing an embodiment of a resin sealed electronic device in accordance with the present invention.

An input/output terminal portion 6 is connected to a circuit board through aluminum wires 5 and wire bonding pads 8. Print resistors, capacitors, MIC and so on are formed on the circuit board 4. A signal output from the circuit board 4 through an aluminum wire 5 drives a power element 1.

The circuit board 4 is fixed on a metallic heat sink 3 with an adhesive.

Figure 2:
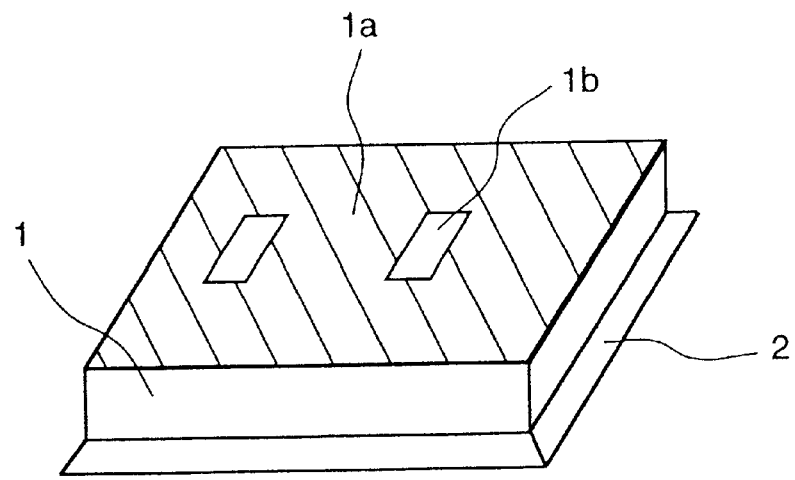
FIG. 2 is a perspective view showing a chip portion of a semiconductor power element.

FIG. 2 is a perspective view showing a chip portion of the semiconductor power element.

The upper surface (surface to be in contact with the resin) except for portions 1b to be used for the bonding pad portions of the semiconductor power element 1 is coated with a polyimide group resin or a polyamide group resin at manufacturing the element (portion 1a).

Figure 3:
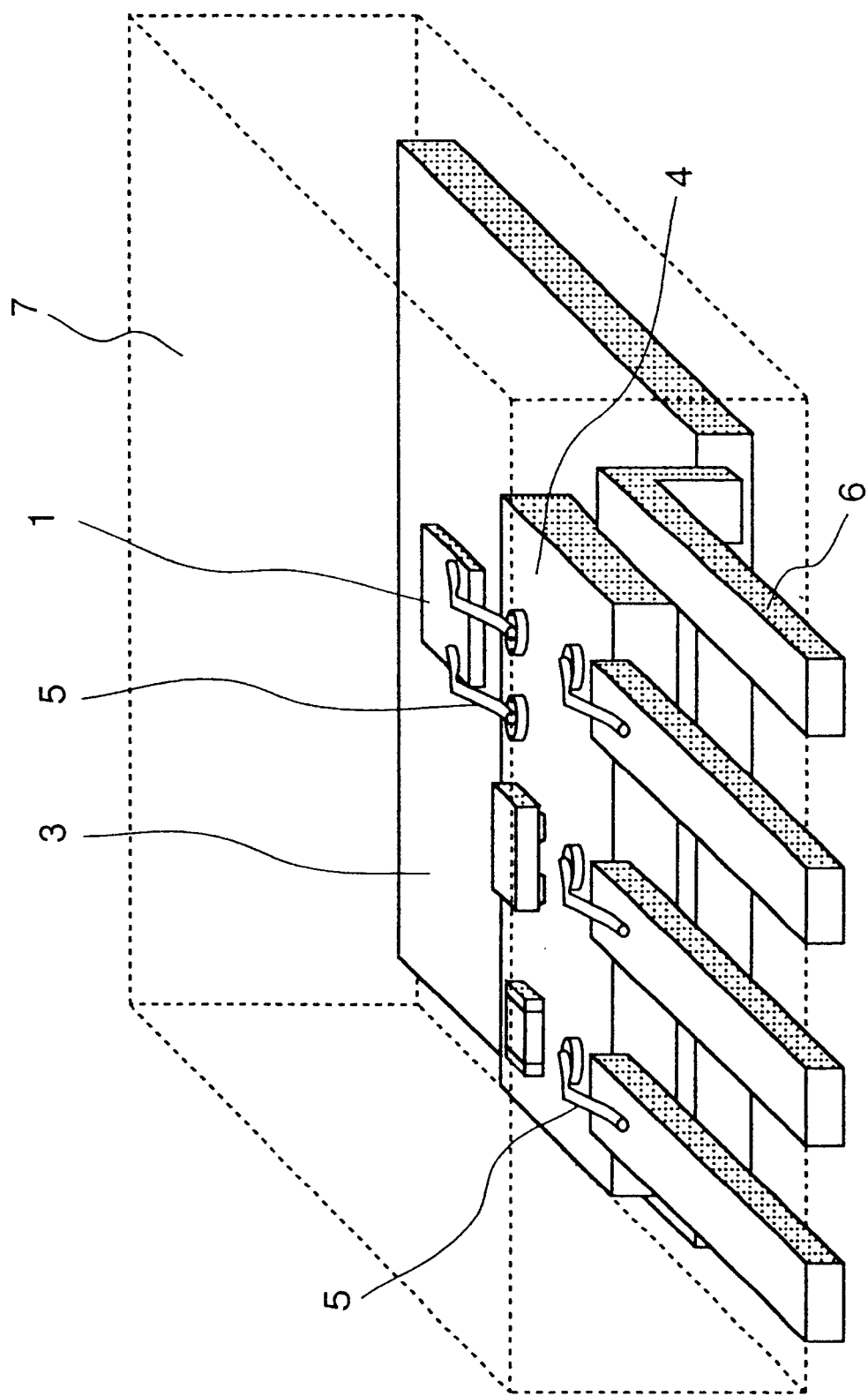
FIG. 3 is a perspective view showing an embodiment of a resin sealed electronic device in accordance with the present invention.

FIG. 3 is a perspective view showing an embodiment of a resin sealed electronic device in accordance with the present invention.

The exterior of the mold resin portion 7 in the figure is illustrated only its outward form so as to easily understood the internal structure. Therein, the parts are identified by the same reference characters as in FIG. 1, and detailed explanation will be omitted here.

By using a power element of which the surface to be in contact with a mold resin 7 is coated with a polyimide group resin at manufacturing the element for the power element 1, the thermal stresses from the mold material 7 is moderated.

Further, by forming a portion without plating (a portion being left the base material of the heat sink as it is) on the reverse side surface of the metallic heat sink 3 (the board mounting portion), tightness of adhesion of the reverse side surface to the mold resin 7 so that the metallic heat sink 3 absorbs the thermal stresses from the mold resin 7.

Furthermore, the thermal stress is reduced by using a mold resin having a linear expansion coefficient within a range of the smallest linear expansion coefficient of $3 \times 10^{-6}$/°C. of the power element 1 to the linear expansion coefficient of $17 \times 10^{-6}$/°C. of copper among the metallic materials (the copper group or the aluminum group material) of the heat sink for the mold resin 7.

Figure 4:
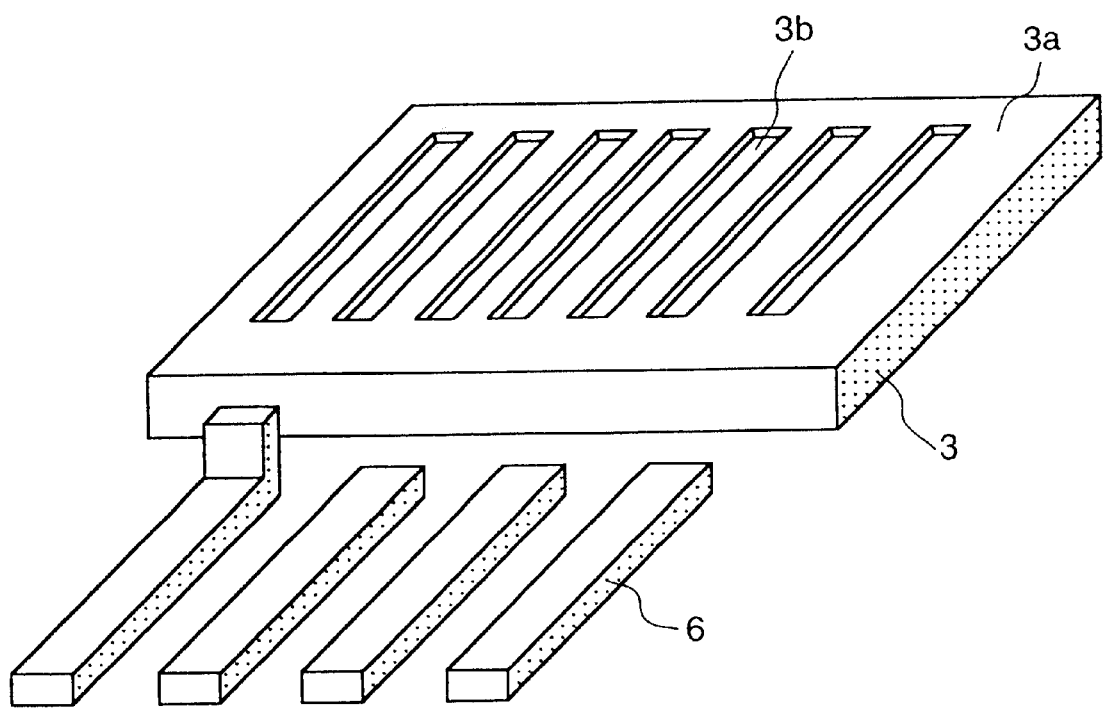
FIG. 4 is a perspective view showing an embodiment of a heat sink portion in accordance with the present invention seeing from the reverse side.

FIG. 4 is a perspective view showing an embodiment of a heat sink portion in accordance with the present invention seeing from the reverse side.

Depressing portions 3b are formed on the reverse side surface 3a of the heat sink 3. By doing so, an area in contact with the resin is increased to improve the tightness of adhesion to the resin. Although the depressing portions in this example are line-shaped projections aligned in rows spaced an equal interval, the same effect can be attained by projections of any shapes such as prism, cone, semi-sphere and the like as far as the projections are capable of expanding the contact area.

Figure 5:
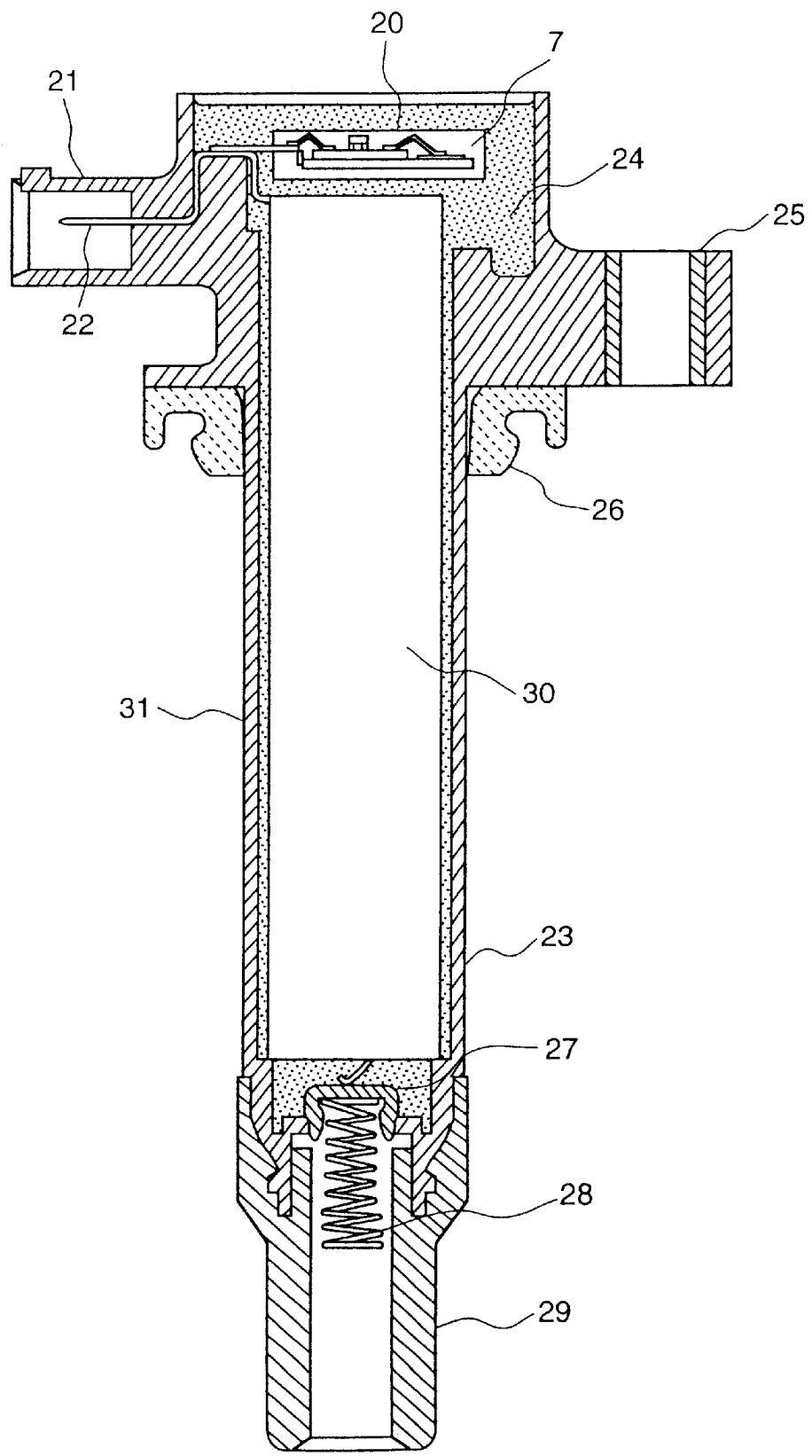
FIG. 5 is a view showing an example in a case where a resin sealed electronic device in accordance with the present invention is mounted on an ignition coil for a vehicle.

FIG. 5 shows an example in a case where a resin sealed electronic device in accordance with the present invention is mounted on an ignition coil for a vehicle.

The figure of this embodiment shows the ignition coil for a vehicle in which the circuit configuration in the resin sealed electronic device in accordance with the present invention is formed in an igniter circuit for ignition (Although this embodiment will be described that a cylindrical coil is used, the present invention is not limited to the shape of the coil).

A case 23 of a cylindrical coil 31 contains a primary and a secondary coils 30 (not shown in detail) and the resin sealed electronic device 20 in accordance with the present invention, and is filled with an injection type epoxy resin 24 to embed them. The signal and the electric power to the coil are input through terminals 22 in a connector portion 21. The secondary voltage generated by the coil is supplied to a spark plug (not shown) through a spring 28 attached to a high voltage terminal 27. A boot portion 29 is engaged with the spark plug 29 to make the connection portion waterproof. A plug hole seal 26 is engaged with a plug hole when the cylindrical coil is mounted onto the engine to make the connection portion waterproof. The coil is fixed to the engine by the bush portion 25 attached to the coil case using a bolt.

In the case where the resin sealed electronic device is embedded in the coil with the epoxy resin as described above, the stress caused by the difference between linear expansion coefficients must be taken into consideration.

When the present invention is applied to such an embodiment, the transfer mold resin can increase the restraint force between the power element (for example, insulated gate bipolar transistor) and the lead frame of the main internal components, and the reliability can be maintained even if the outside of the present electronic device is further embedded with the resin having a different linear expansion coefficient.

Figure 6:
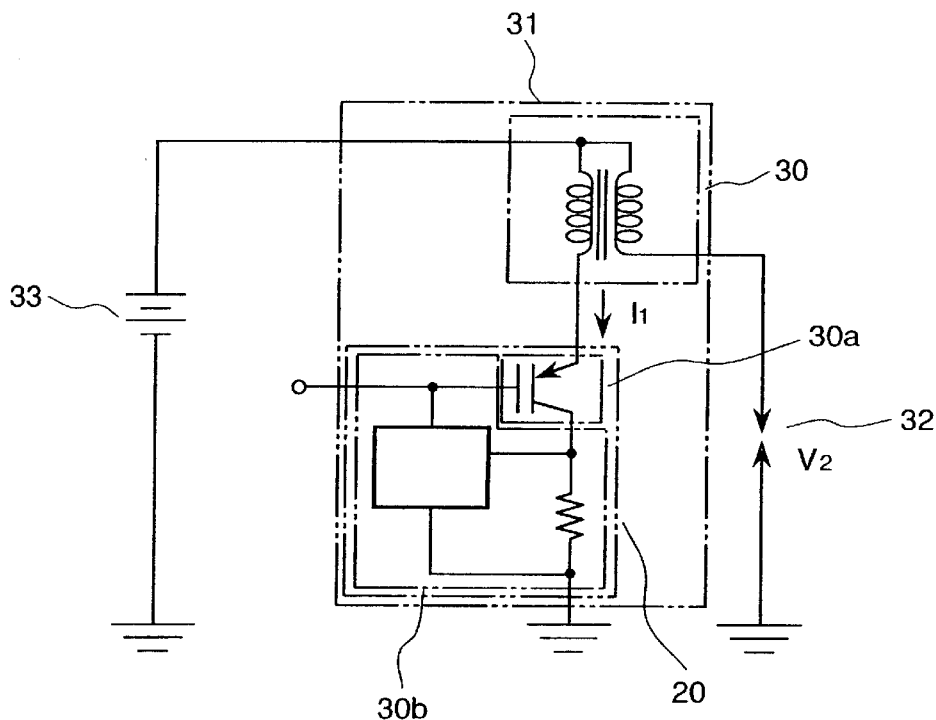
FIG. 6 is a circuit diagram of the coil of FIG. 5.

FIG. 6 is a circuit diagram of the coil of FIG. 5.

Electric power is supplied from an electric power source 33 to the coil 31 containing the resin sealed electronic device having the circuit configuration of the igniter. A hybrid circuit 30b mounting a flip chip and the power element portion 30a (in this case, an insulated gate bipolar transistor) are contained in the resin sealed electronic device having the circuit configuration of the igniter. A signal from an engine control unit (not shown) is signal processed by the hybrid circuit 30b, and then drives the power element 30a to conduct and interrupt the primary current of the coil 30. At that time, a high voltage is generated in the secondary side of the coil 30 to be supplied to the spark plug 32.

Figure 7:
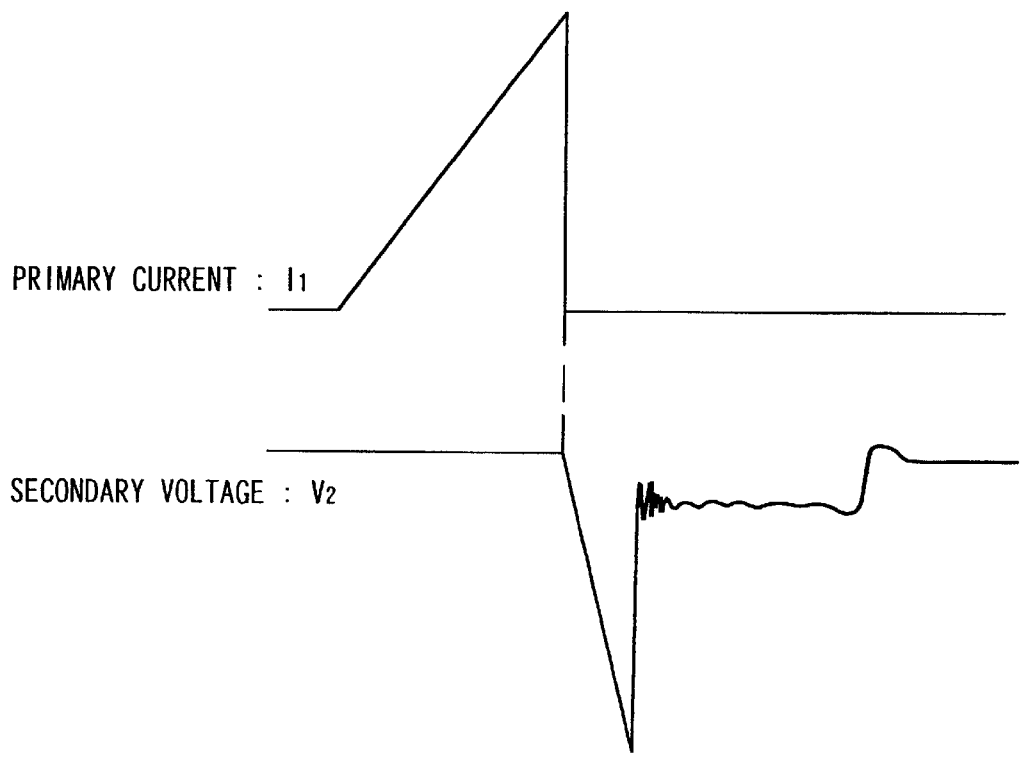
FIG. 7 is a chart showing operating waveforms of the coil of FIG. 6.

FIG. 7 is a chart showing operating waveforms of the coil of FIG. 6.

As shown in the figure, when the primary current I1 is interrupted, the secondary voltage V2 is generated in the secondary side of the coil. It is not shown in the figure that the primary current is generally interrupted at approximately 6 to 8 A, and at that time the generated secondary voltage is approximately 20 to 30 kV.

Figure 8:
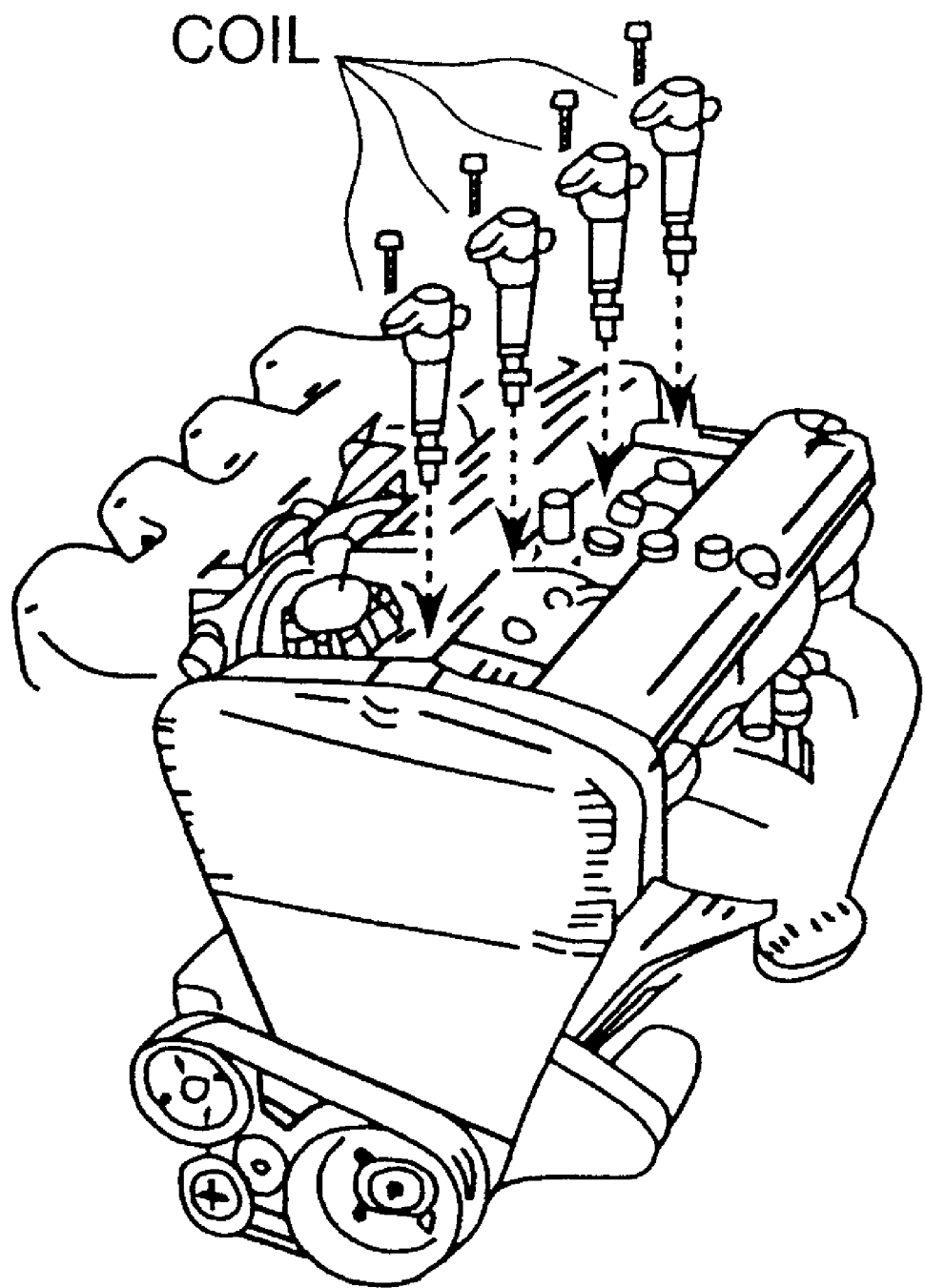
FIG. 8 is a view showing a feature of the coils mounted on an engine.

FIG. 8 is a view showing a feature of the coils mounted on an engine.

Since the embodiment is the cylindrical coil, the coils are inserted into and attached to the plug holes of the engine. In the case where the present resin sealed electronic device is incorporated in the coil as described above, because the coil is directly attached to the engine, it is particularly necessary to take the thermal stress into consideration. However, it is possible to maintain the reliability by applying the present invention.

In the resin sealed electronic device having the circuit board and the power element and integrated in a unit with transfer mold, a power element coated with a polyimide group or a polyamide group resin at manufacturing the element is used for the power element to moderate the stress acting on the power element portion by improving the tightness of adhesion to the mold resin. Further, by using the heat sink having the non-plated portions (portions being left the base material of the heat sink as it is) where the board and the semiconductor power element are mounted, tightness of adhesion of the heat sink to the mold resin is increased. In addition, by using a mold resin having a linear expansion coefficient within a range of $3 \times 10^{-6}/°C$. to $17 \times 10^{-6}/°C$., the thermal stress acting on the contained components can be reduced, and the thermal cycle resistance can be improved, and accordingly the high reliability can be attained.

What is claimed is:

1. A resin sealed electronic device which is formed by fixing a hybrid IC board composing an electronic circuit; a semiconductor power element operated by a signal from said electronic circuit; a heat sink mounting said board and said semiconductor element, said heat sink being made of a metallic material; and input and output terminals with transfer mold by a resin, wherein a surface of the semiconductor power element opposite to a surface facing said heat sink is coated with a polyimide group or a polyamide group material, and the reverse side surface of the heat sink bares a metallic base material of the heat sink, and a linear expansion coefficient of said resin is within a range of $3 \times 10^{-6}/°C$. to $17 \times 10^{-6}/°C$.

2. A resin sealed electronic device according to claim 1, wherein the material of said heat sink is a copper group material.

3. A resin sealed electronic device according to claim 1, wherein the material of said heat sink is an aluminum group material.

4. A resin sealed electronic device according to claim 1, wherein projections and depressions are formed on the reverse side surface of the heat sink portion of the metallic base to further improve tightness of adhesion to the resin.

5. A resin sealed electronic device according to claim 1, wherein an ignition coil for a vehicle is constructed by forming a control circuit for controlling conducting and interrupting of a primary current of the igniter according to an ignition signal from an engine control unit in the electronic circuit portion on the hybrid IC board, and by using a bipolar power transistor or an insulated gate bipolar power transistor for conducting and interrupting the primary current for the semiconductor power element.

* * * * *